(12) United States Patent
Miller

(10) Patent No.: US 7,786,012 B2
(45) Date of Patent: Aug. 31, 2010

(54) TAPERED EDGE EXPOSURE FOR REMOVAL OF MATERIAL FROM A SEMICONDUCTOR WAFER

(75) Inventor: Keith R. Miller, Wappingers Falls, NY (US)

(73) Assignee: GlobalFoundries Inc., Grand Cayman (KY)

( * ) Notice: Subject to any disclaimer, the term of this patent is extended or adjusted under 35 U.S.C. 154(b) by 560 days.

(21) Appl. No.: 11/684,731

(22) Filed: Mar. 12, 2007

(65) Prior Publication Data

US 2008/0227299 A1    Sep. 18, 2008

(51) Int. Cl.
*H01L 21/311* (2006.01)

(52) U.S. Cl. ............................. 438/694; 257/E21.214; 430/5

(58) Field of Classification Search ................ 430/5; 438/694, 401; 257/E21.214
See application file for complete search history.

(56) References Cited

U.S. PATENT DOCUMENTS 6,875,971 B2 *   4/2005   Kim ..................... 250/201.2

* cited by examiner

*Primary Examiner*—W. David Coleman
*Assistant Examiner*—Sonya D McCall-Shepard
(74) *Attorney, Agent, or Firm*—Ingrassia Fisher & Lorenz, P.C.

(57) ABSTRACT

A semiconductor wafer edge exposure process as described herein employs a photoresist exposure step that exposes photoresist material to radiation having a gradient intensity profile near the outer edge of the wafer. The gradient intensity profile creates a tapered outer edge in the developed photoresist material, which in turn creates a tapered outer edge in the underlying target material after etching. Different gradient intensity profiles can also be used for subsequent layers of material. The resulting tapered edge profile of the wafer is resistant to edge peeling and flaking.

16 Claims, 6 Drawing Sheets

TAPERED EDGE EXPOSURE FOR REMOVAL OF MATERIAL FROM A SEMICONDUCTOR WAFER

TECHNICAL FIELD

Embodiments of the subject matter described herein relate generally to semiconductor wafer processing. More particularly, embodiments of the subject matter relate to an edge exposure procedure for selectively removing material near the edge of a wafer.

BACKGROUND

The prior art includes many processes and technologies related to the fabrication of semiconductor wafers. The fabrication of integrated circuits on a semiconductor wafer involves the formation of layers of material on a semiconductor substrate, where such layers typically include dielectric (insulating) layers and metal (conductive) layers. Features on a given layer of material are usually created by way of photolithography: the layer of material is coated with photoresist; the photoresist is exposed with radiation through a pattern or a mask that defines the desired features; and the photoresist is developed to enable selective removal of the exposed (or unexposed) photoresist. After developing, the remaining photoresist material represents a pattern that can be used for a subsequent processing step such as etching. In practice, a wafer may have many layers of materials that are treated in this manner, resulting in a "stack" of dielectric and conductive metal layers.

Photoresist material is usually applied to the surface of the wafer in liquid form as the wafer is spinning (spin coating). The centrifugal force resulting from the spinning causes the photoresist to spread across the surface of the wafer. A small amount of the photoresist flows around the perimeter edge of the wafer, resulting in non-uniform photoresist thickness near the edge. Edge exposure procedures can be utilized to remove photoresist and/or material located at or near the edge of the wafer. Such edge exposure procedures typically expose only the edge of the wafer in a separate step, i.e., the remaining area of the photoresist layer is exposed to create the desired pattern in a different step.

Conventional edge exposure processes do not provide precise control of the resulting film profile at the edge of the wafer. A discontinuous edge profile may be formed, and such discontinuities can cause peeling or flaking of the material layers. Edge peeling can result in the migration of contaminates into the patterned section of the wafer, which impacts manufacturing yields. This problem is exacerbated when many layers of material are formed on the substrate.

BRIEF SUMMARY

The edge exposure process described herein allows for fine adjustments in the exposure at the edge of a wafer. The edge of the wafer is exposed using an illumination gradient that results in a tapered (or other variable cross section) edge profile in the etched material layer. By tapering the photoresist layer via a gradient edge exposure, the subsequent etch of the underlying material layer results in a gradual taper of the film, potentially minimizing the impact of edge peeling as well as providing a more consistent and predictable edge profile as multiple layers of insulating and conducting material are patterned.

One embodiment of an edge exposure method for a semiconductor wafer method involves: forming a first layer of material on a substrate having an outer periphery; forming a first layer of photoresist on the first layer of material; exposing the first layer of photoresist near the outer periphery with gradient illumination, resulting in a first exposed photoresist layer; developing the first exposed photoresist layer, resulting in a first developed photoresist layer having a tapered edge in cross section; and etching the first developed photoresist layer and the first layer of material, resulting in a first etched layer of material having a tapered edge in cross section.

The above and other aspects may be carried out in an embodiment of an edge exposure method for a semiconductor wafer having a substrate, a layer of material formed on the substrate, and a layer of photoresist formed on the layer of material. The method involves: obtaining an inner radius and an outer radius for an illumination gradient; obtaining a gradient profile for the illumination gradient; exposing a peripheral section of the layer of photoresist with radiation controlled by the illumination gradient; and creating, in response to the exposing step, an exposed photoresist layer having non-uniform characteristics between the inner radius and the outer radius, the non-uniform characteristics being controlled by the illumination gradient.

The above and other aspects may be carried out in an embodiment of an edge exposure method for a semiconductor wafer having a substrate, a layer of material formed on the substrate, and a layer of photoresist formed on the layer of material. The method involves: exposing a peripheral section of the layer of photoresist with radiation having an intensity profile that varies between an inner radial dimension of the semiconductor wafer and an outer radial dimension of the semiconductor wafer, resulting in an exposed photoresist layer; developing the exposed photoresist layer, resulting in a developed photoresist layer having a tapered peripheral photoresist edge; and etching the developed photoresist layer and the layer of material, resulting in an etched layer of material having a tapered peripheral material edge.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the invention or the application and uses of such embodiments. For the sake of brevity, conventional techniques related to photolithography and semiconductor device fabrication may not be described in detail herein. Moreover, the various tasks and process steps described herein may be incorporated into a more comprehensive procedure or process having additional steps or functionality not described in detail herein.

Figure 16:
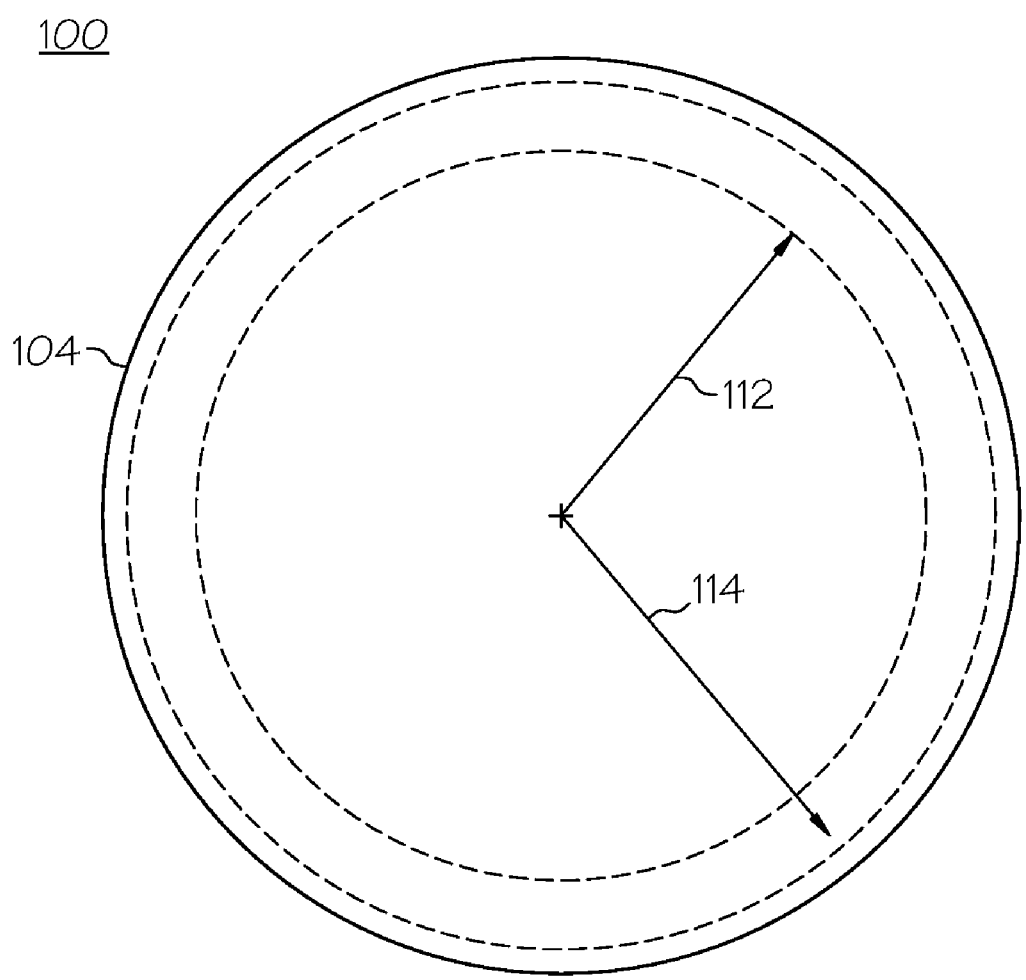
FIG. 16 is a schematic top view that depicts a wafer and boundaries utilized in connection with an embodiment of an edge exposure process.

FIGS. 1-8 are cross sectional views illustrating a wafer 100 undergoing an embodiment of an edge exposure process. In practice, the edge exposure process described below may be incorporated into a suitably configured module of an existing track system. For example, the edge exposure process described below can be implemented in a module employed as a portion of a track system that is attached to a stepper. Of course, the edge exposure techniques and technologies may be implemented in any suitable module, track location, or subsystem associated with a wafer process. Wafer 100 includes a substrate 102 upon which various layers of material are formed. Referring to the top view depicted in FIG. 16, wafer 100 is realized as a thin disk having a generally round outer periphery or perimeter 104 that represents the outer edge of wafer 100. FIGS. 1-8 depict the edge of wafer 100 near this outer periphery 104. For this example, substrate 102 is a semiconductor substrate formed from a material such as silicon, gallium arsenide, germanium, or any suitable substrate material. Wafer 100 may eventually correspond to an entire integrated circuit (IC) device or multiple IC devices (e.g., memory devices, processor devices, input/output devices, or the like). Upon completion of the fabrication process, wafer 100 can include one or more layers of material and/or features, such as lines, interconnects, vias, doped regions, or the like, and devices on wafer 100 can include transistors, microactuators, microsensors, capacitors, resistors, diodes, or the like.

In connection with a wafer fabrication process, layers of material are formed on a substrate such as substrate 102. For simplicity, the following description of the edge exposure technique refers to the processing of the first and second layers on the substrate. In practice, however, the edge exposure technique need not begin at the first layer, and the edge exposure technique need not be performed for all layers on the substrate. Moreover, the edge exposure technique may be performed for any number of layers; only two layers are described below for the sake of brevity.

During the wafer fabrication process, a first layer 106 of material is formed on substrate 102 using any suitable technique. The thickness and composition of layer 106 is selected in accordance with the desired process technology and intended device topology. Layer 106 can be a dielectric layer, a conductive layer, a barrier layer, or any target material to be etched, doped, treated, processed, or layered. In one embodiment, layer 106 is realized as one or more layers of materials, such as polycrystalline silicon and/or one or more of titanium silicide, tungsten silicide, cobalt silicide, and/or other materials alone or in alternating layers. In another embodiment, layer 106 is a hard mask layer, such as a silicon nitride layer or a metal layer. The hard mask layer can serve as a patterned layer for processing substrate 102 or for processing a layer upon substrate 102. In yet another embodiment, layer 106 is an antireflective coating (ARC). Substrate 102 and layer 106 are not described in a limiting fashion, and can each comprise a conductive, semiconductive, or insulative material.

After formation of layer 106, an antireflective coating and/ or an adhesion layer may be formed on layer 106. For example, a bottom antireflective coating (BARC) may be applied prior to forming a layer of photoresist material over layer 106. For simplicity and clarity, these intermediate coatings or layers are not separately depicted in FIG. 1. Eventually, a first photoresist layer 108 is formed on layer 106. The thickness and composition of photoresist layer 108 is selected in accordance with the desired process technology. Photoresist layer 108 can comprise a variety of photoresist materials, compositions, or chemicals suitable for lithographic applications. The photoresist material is selected to have photochemical reactions in response to electromagnetic radiation emitted from a light source (not shown) and to have sufficient transparency to the electromagnetic radiation to allow useful patterning of photoresist layer 108. Materials comprising photoresist layer 108 can include, among others, a matrix material or resin, a sensitizer or inhibitor, and a solvent. Photoresist layer 108 may be a chemically amplified, positive or negative tone, organic-based photoresist. Although not required, this example assumes that photoresist layer 108 is formed from a positive photoresist material. Photoresist layer 108 may also be a silicon-containing photoresist. Photoresist layer 108 may be, but is not limited to, an acrylate-based polymer, an alicyclic-based polymer, or a phenolic-based polymer.

Photoresist layer 108 is formed over layer 106 using any suitable technique. For example, photoresist layer 108 may be deposited by spin coating over layer 106. The thickness of photoresist layer 108 is selected according to the particular lithographic technology, e.g., for use in vacuum ultraviolet (VUV) lithography, DUV lithography, and/or extreme ultraviolet lithography (using, for example, exposing light having a wavelength of 193 nm, 157 nm, 126 nm, or 13.4 nm). In this regard, photoresist layer 108 may have a thickness in the range of 15-1000 nm, with a preferred thickness in the range of 50-500 nm.

Figure 1:
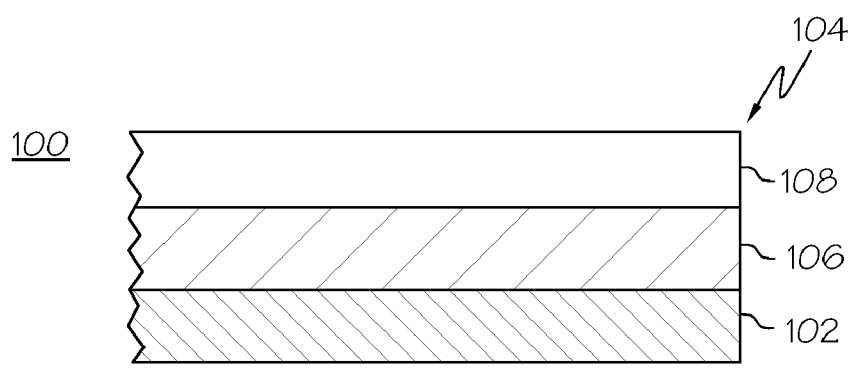
FIGS. 1-8 are cross sectional views illustrating a wafer undergoing an embodiment of an edge exposure process.
Figure 2:
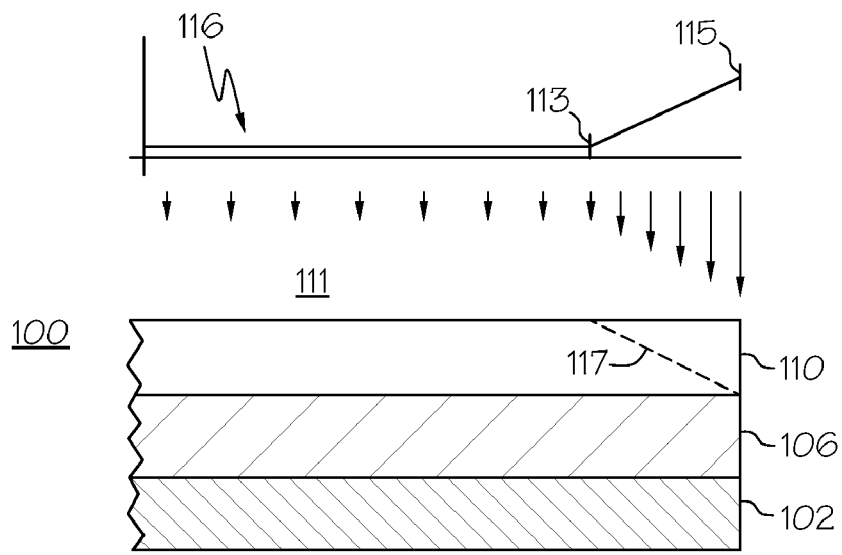

Wafer 100 resembles that shown in FIG. 1 after application of photoresist layer 108. Photoresist layer 108 may be subjected to a pre-exposure baking step to prepare it for exposure. FIG. 2 depicts a step of exposing photoresist layer 108 near outer periphery 104 with gradient illumination 111. This exposing step results in an exposed photoresist layer 110. In practice, photoresist layer 108 can be processed with a suitably configured lithographic system having a rotating platform, a light or radiation source, optics elements, and a gradient mask or gray scale element that influences the intensity and/or other characteristics of the light (radiation) emitted from the source. As used herein, "gradient illumination" means that the illuminating radiation 111 that reaches wafer 100 has variable intensity characteristics, namely, varying intensity between an inner boundary (e.g., an inner radius) to an outer boundary (e.g., an outer radius). For example, referring to FIG. 16, an inner radial dimension 112 of wafer 100 may represent the inner boundary of an illumination gradient, and an outer radial dimension 114 of wafer 100 may represent the outer boundary of the illumination gradient, where the illuminating radiation 111 or light has an intensity profile that varies between the boundaries. For an embodiment that utilizes a positive photoresist material, the gradient profile of the illumination gradient results in relatively low radiation energy near the inner radius during the exposing step, and relatively high radiation near the outer radius during the exposing step.

The particular characteristics of the illumination gradients utilized during an edge exposure process may be selected to provide any desired exposure profile. In practice, the lithographic system may include a feature that allows the selection and setting of parameters that influence the characteristics of the illumination gradients. In this regard, the lithographic system may facilitate the setting of the inner and outer boundaries of the illumination gradients (which may involve obtaining, defining, or identifying an inner radius and an outer radius for the gradients), setting, defining, or obtaining the gradient profile between the inner and outer boundaries (e.g., a simple sloped profile as depicted in FIG. 2), setting, defining, or obtaining radiation/light intensity characteristics, setting, defining, or obtaining exposure times, or the like. In contrast, conventional edge exposure processes only control the inner boundary of the illuminating source and illuminate the edge of the wafer using radiation having a constant intensity.

FIG. 2 depicts a plot of an illumination gradient 116 suitable for use with a positive photoresist material. Illumination gradient 116 is merely one appropriate implementation, and it is not intended to limit or otherwise restrict the scope or application of the techniques described herein. The vertical scale of the plot represents radiation intensity or energy, and the horizontal scale represents the radial dimension of wafer 100. The arrows in FIG. 2 represent the varied energy in illuminating radiation 111 caused by illumination gradient 116: the short arrows indicate that little or no exposing radiation reaches wafer 100, the longest arrow indicates the highest intensity of exposing radiation reaching wafer 100, and the lengths of the other arrows indicate increasing intensity in the radial dimension. Thus, the intensity profile for the illuminating radiation 111 results in relatively low radiation energy near an inner radial dimension 113, and relatively high radiation energy near an outer radial dimension 115. In FIG. 2, illumination gradient 116 has a simple sloped characteristic that begins at a point corresponding to an inner boundary and extends to a point corresponding to an outer boundary. This sloped characteristic corresponds to an increase in the radiation energy with an increase in the radial dimension of wafer 100. The dashed line 117 in exposed photoresist layer 110 indicates a desired resulting characteristic in the developed photoresist. As shown in FIG. 2, the illumination gradient 116 is preferably configured such that photoresist layer 108 is exposed in the desired manner, resulting in exposed photoresist layer 110.

In accordance with known photolithography technology, the gradient illumination exposes photoresist layer 108, which chemically reacts to the gradient radiation, resulting in exposed photoresist layer 110. Thus, the exposing step is influenced and governed by the gradient profile, its inner and outer boundaries, and the manner in which its radiation intensity/energy varies in the radial dimension. Due to the illumination gradient 116, exposed photoresist layer 110 will have non-uniform (varying) characteristics between the inner radius and the outer radius of the gradient profile. For this embodiment, the edge exposure process exposes a peripheral section of photoresist layer 108 with radiation that is controlled by the illumination gradient. In other words, the edge exposure process need not (and preferably does not) expose the central area of wafer 100 where the desired circuit features will be or have been patterned.

Figure 3:
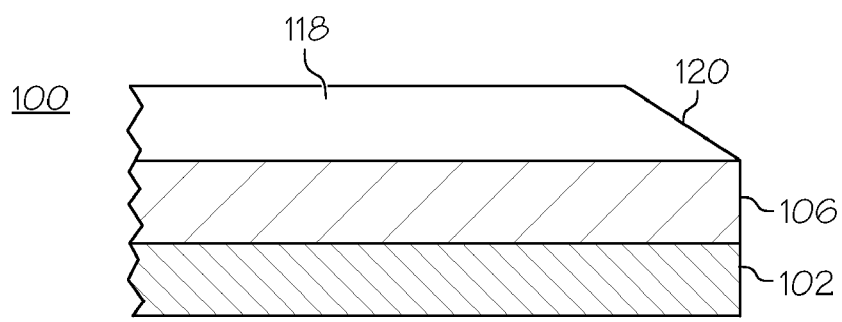

After exposure, the exposed photoresist layer 110 is developed to form a developed photoresist layer 118 (shown in FIG. 3). Notably, developed photoresist layer 118 has a tapered edge 120 in cross section, which is caused by the gradient illumination used during photoresist exposure. For the illustrated embodiment, the tapered peripheral photoresist edge is gradually sloped from the upper surface of developed photoresist layer 118 to the upper surface of layer 106. Again, this simple sloped profile for tapered edge 120 is merely one suitable profile for a developed photoresist layer.

Figure 4:
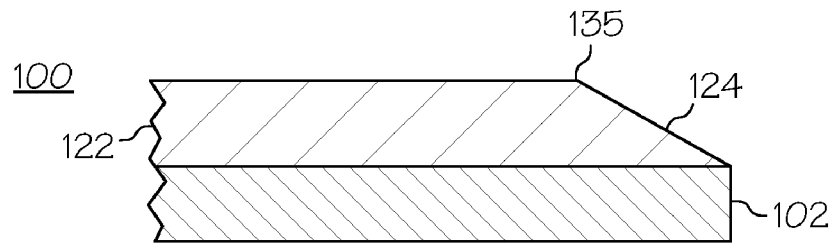

Although other IC circuit fabrication steps or sub-processes may be performed after formation of developed photoresist layer 118, this example continues with an etching step, which may be associated with an isotropic etch technique, an anisotropic etch technique, or any suitable etch technique. In accordance with this embodiment, developed photoresist layer 118 is utilized during an etching step where an area of layer 106 is etched away. Developed photoresist layer 118 is also etched away (at least partially) during the etching step. The etching of wafer 100 results in an etched layer 122 of material having a tapered edge 124 in cross section (FIG. 4 depicts the result of such an etching step). Referring again to FIG. 3, the area of the target material under tapered edge 120 of developed photoresist layer 118 is etched to form an angled or tapered profile because the thinner portion of tapered edge 120 is etched away before the thicker portion of tapered edge 120. Thus, the target material located under the thinner portion of tapered edge 120 is etched more, while the target material located under the thicker portion of tapered edge 120 is etched less. Consequently, the target material of layer 106 is etched more at the outer periphery of wafer 100 and less toward the center of wafer 100. For the illustrated embodiment, the tapered peripheral material edge of layer 122 is gradually sloped from the upper surface of layer 122 to the upper surface of substrate 102. Notably, the gradient profile of the illuminating radiation used during photoresist exposure influences the slope characteristic of tapered edge 124. Again, this simple sloped profile for tapered edge 124 is merely one suitable profile for an etched layer of material.

Figure 5:
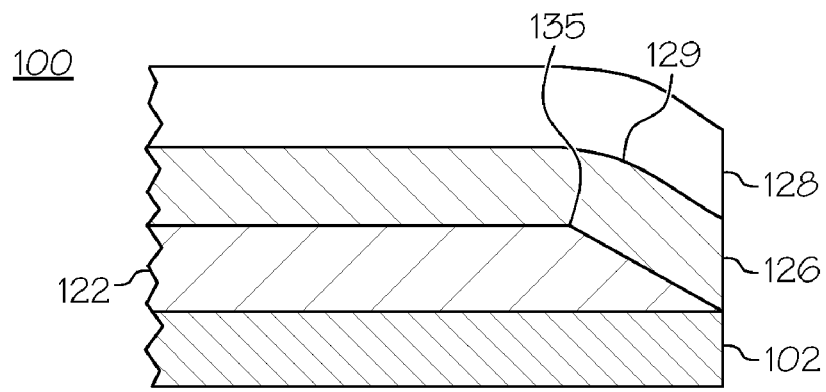

Although other IC circuit fabrication steps or sub-processes may be performed after formation of etched layer 122 (e.g., removal of any excess photoresist material), this example continues with the formation of an additional layer 126 of material over etched layer 122 of material, and, thereafter, the formation of another photoresist layer 128 on layer 126. FIG. 5 depicts wafer 100 after formation of layer 126 and photoresist layer 128. For simplicity and clarity, any intermediate coatings or layers (e.g., BARC) are not separately depicted in FIG. 5. Layer 126 may be a dielectric layer, a metal layer, or any layer, coating, or material described above for the first layer 106. Photoresist layer 128 may be formed from any suitable photoresist material, including the photoresist materials described above for photoresist layer 108. The thickness and composition of layer 126 and the thickness and composition of photoresist layer 128 are selected in accordance with the desired process technology and intended device topology.

Wafer 100 resembles that shown in FIG. 5 after application of photoresist layer 128, which may be subjected to a pre-exposure baking step to prepare it for exposure. Notably, the second layer 126 of material has a contour that follows the tapered peripheral edge of etched layer 122. In other words, layer 126 generally follows the shape of underlying etched layer 122. This contoured portion of layer 126 is depicted as a curved or bent section 129 in FIG. 5.

Figure 6:
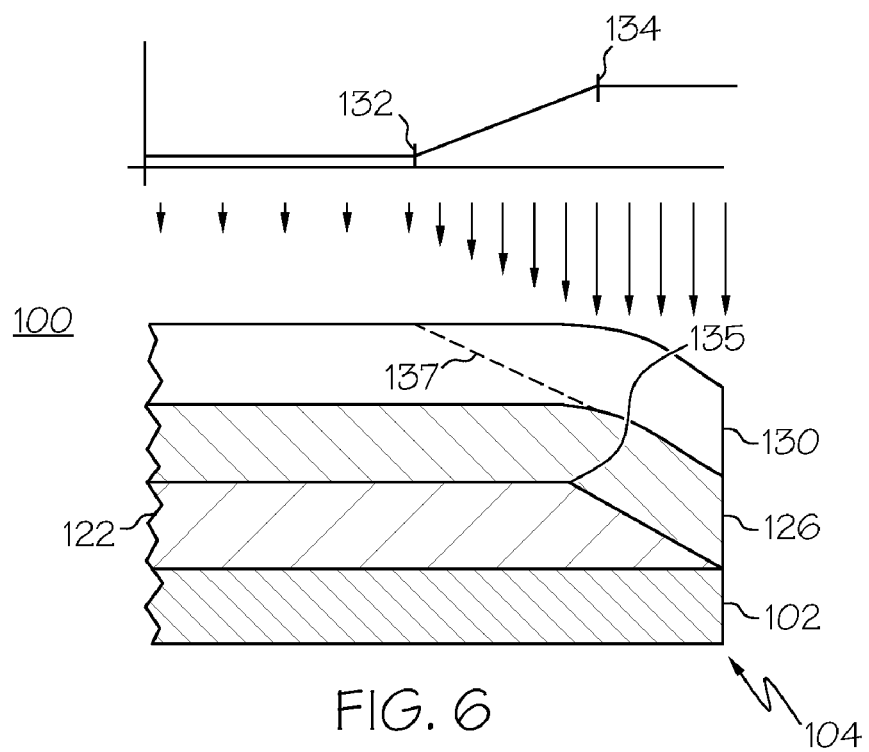

FIG. 6 depicts a step of exposing photoresist layer 128 near outer periphery 104 with gradient illumination, resulting in an exposed photoresist layer 130. This exposing step is similar to that described above, however, a different gradient profile is utilized. For the sake of brevity, common features and aspects of the exposure technique will not be redundantly described here. For this exemplary exposing step, the gradient profile defines an inner radial dimension 132 that represents the start of the gradient, and an outer radial dimension 134 that represents the end of the gradient. The gradient profile may also define an outer boundary dimension corresponding to outer periphery 104. Notably, inner radial dimension 132 is less than the respective inner radial dimension 113 employed by illumination gradient 116, and outer radial dimension 134 is less than the respective outer radial dimension 115 employed by illumination gradient 116 (see FIG. 2). For this particular embodiment, outer radial dimension 134 is aligned with the upper radial dimension 135 of the tapered edge of etched layer 122. Such alignment may be desirable to obtain the intended wafer edge profile (see FIG. 8).

FIG. 6 depicts a plot of the illumination gradient utilized during the second exposure. The short arrows in FIG. 6 indicate that little or no exposing radiation reaches wafer 100, the longest arrow indicates the highest intensity of exposing radiation reaching wafer 100, and the lengths of the other arrows indicate increasing intensity in the radial dimension. Thus, the intensity profile for the illuminating radiation results in no (or relatively low) radiation energy inside inner radial dimension 132, relatively high radiation energy outside outer radial dimension 134, and increasing radiation energy from inner radial dimension 132 to outer radial dimension 134. The dashed line 137 in exposed photoresist layer 130 indicates a desired resulting characteristic in the developed photoresist.

Figure 7:
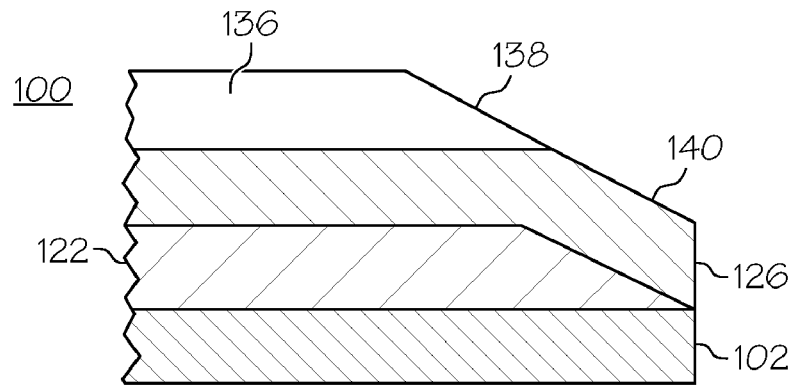

After exposure, the exposed photoresist layer 130 is developed to form a developed photoresist layer 136 (shown in FIG. 7). Notably, developed photoresist layer 136 has a tapered edge 138 in cross section, which is caused by the gradient illumination used during photoresist exposure. For the illustrated embodiment, the photoresist material has been removed from the contoured edge 140 of layer 126, and tapered edge 138 of developed photoresist layer 136 terminates at a location that roughly corresponds to the beginning of the contoured edge 140.

Figure 8:
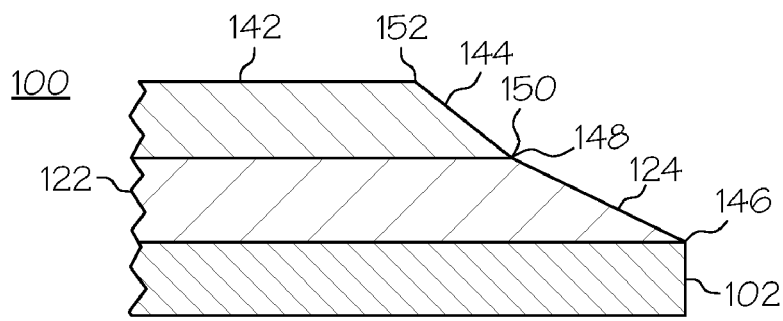

Although other IC circuit fabrication steps or sub-processes may be performed after formation of developed photoresist layer 136, this example continues with an etching step, which may be associated with an isotropic etch technique, an anisotropic etch technique, or any suitable etch technique. The etching of wafer 100 results in an etched layer 142 of material having a tapered edge 144 in cross section (FIG. 8 depicts the result of such an etching step). For the illustrated embodiment, the steps of exposing photoresist layer 128, developing exposed photoresist layer 130, and etching developed photoresist layer 136 and layer 126 cause tapered edge 144 of etched layer 142 to be continuous (within practical tolerances) with tapered edge 124 of etched layer 122. In other words, the edge exposure process is suitably controlled to create a relatively smooth transition between etched layer 122 and etched layer 124, which minimizes discontinuities that might otherwise cause peeling, flaking, and contamination of wafer 100. For this particular embodiment, tapered edge 124 of etched layer 122 defines a lower perimeter 146 of the first layer of material, an upper perimeter 148 of the first layer of material, and a sloped surface of the first layer of material, where the sloped surface is between the upper perimeter and the lower perimeter. Similarly, tapered edge 144 of etched layer 142 defines a lower perimeter 150 of the second layer of material, an upper perimeter 152 of the second layer of material, and a sloped surface of the second layer of material, where the sloped surface is between the upper perimeter and the lower perimeter. As depicted in FIG. 8, the upper perimeter of the first layer of material corresponds to the lower perimeter of the second layer of material, resulting in a smooth and continuous (within practical tolerances) tapered edge for wafer 100.

The technique described above may be repeated for any number of additional layers formed on wafer 100. In one preferred embodiment, the technique is performed for each layer formed on wafer 100 to create an overall edge profile that transitions smoothly without discontinuities.

Figure 9:
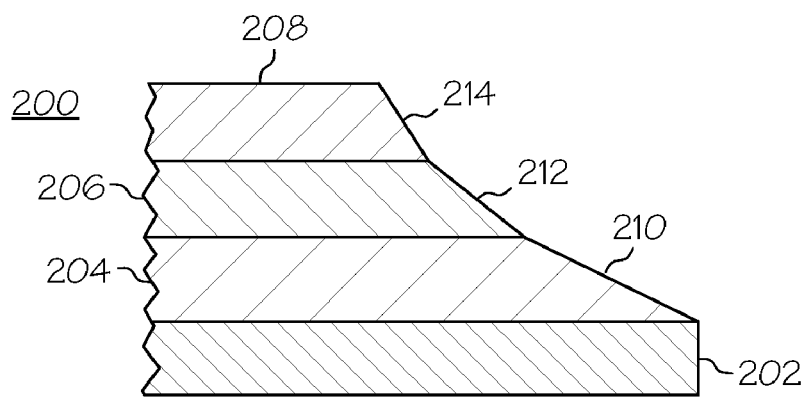
FIGS. 9 and 10 are cross sectional views that illustrate wafers having different edge profiles.

FIG. 9 is a cross sectional view of a wafer 200 having a different edge profile than that depicted in FIG. 8. Wafer 200 includes a substrate 202, a first layer 204 of material formed on substrate 202, a second layer 206 of material formed on first layer 204, and a third layer 208 of material formed on second layer 206. The edge exposure techniques described above can be employed (with modified illumination gradient profiles) to create a sloped edge 210 for layer 204, a sloped edge 212 for layer 206, and a sloped edge 214 for layer 208. Here, sloped edge 210 is relatively gradual, sloped edge 214 is relatively steep, and sloped edge 212 is relatively intermediate. In other words, the slope of edge 214 is greater than the slope of edge 212, which in turn is greater than the slope of edge 210. These edge profiles can be controlled using different radiation intensity profiles for the respective photoresist exposure steps.

Figure 10:
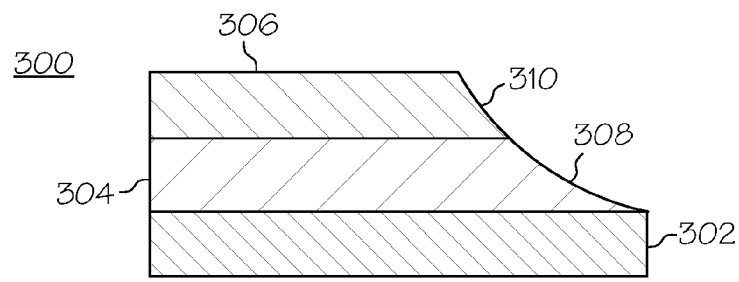

FIG. 10 is a cross sectional view of a wafer 300 having a different edge profile than that depicted in FIG. 8 or FIG. 9. Wafer 300 includes a substrate 302, a first layer 304 of material formed on substrate 302, and a second layer 306 of material formed on first layer 304. The edge exposure techniques described above can be employed (with modified illumination gradient profiles) to create a curved edge 308 for layer 304 and a curved edge 310 for layer 306. In this embodiment, curved edge 308 and curved edge 310 are continuous (within practical tolerances) such that they combine to form a curved transition for the edge of wafer 300. The individual edge profiles can be controlled using different radiation intensity profiles for the respective photoresist exposure steps.

FIGS. 11-15 are cross sectional views illustrating a wafer 400 undergoing an alternate embodiment of an edge exposure process. Some of the techniques, process steps, and features of this edge exposure process were described above in the context of wafer 100. For the sake of brevity, such common aspects will not be redundantly described here in the context of wafer 400.

Figure 11:
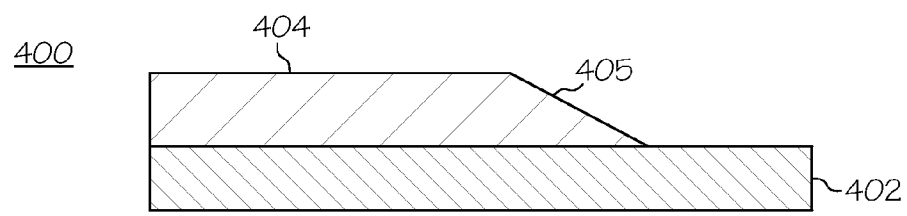
FIGS. 11-15 are cross sectional views illustrating a wafer undergoing an alternate embodiment of an edge exposure process.
Figure 12:
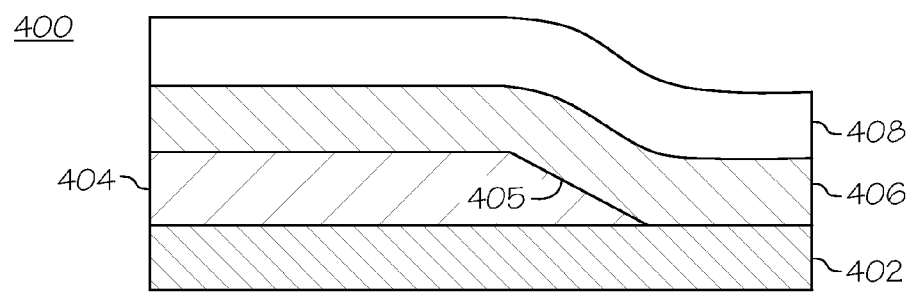

FIG. 11 shows wafer 400 with a substrate 402 and an etched layer 404 of material formed on substrate 402. FIG. 11 depicts wafer 400 after etching has been performed in the manner described above. In this regard, etched layer 404 may include a tapered edge 405. For comparison, FIG. 11 is equivalent to FIG. 4 in many respects except that a portion of the substrate 402 is exposed at the peripheral edge. FIG. 12 depicts wafer 400 after a second layer 406 of material has been formed on etched layer 404, and after a photoresist layer 408 has been formed on layer 406. In contrast to the embodiment depicted in FIGS. 1-8, second layer 406 is suitably formed over etched layer 404 and beyond tapered edge 405. In other words, a portion of second layer 406 is formed on substrate 402 (or on an intermediate coating or layer that resides on substrate 402). This portion of second layer 406 is proximate the outer edge of wafer 400. Accordingly, second layer 406 follows the contour and shape of tapered edge 405 as depicted in FIG. 11. Moreover, photoresist layer 408 is formed over second layer 406 in a similar manner such that it generally follows the contour and shape of tapered edge 405.

Figure 13:
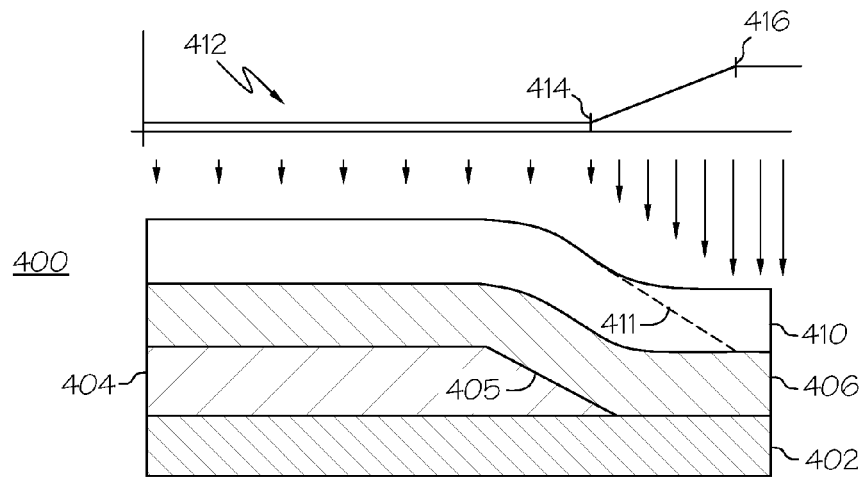
Figure 14:
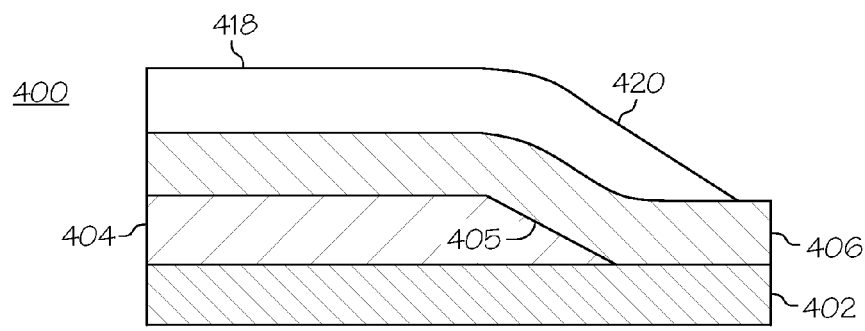

FIG. 13 shows wafer 400 during a photoresist exposure step. This step results in an exposed photoresist layer 410 having the desired characteristic indicated by the dashed line 411 in FIG. 13. As described above, the photoresist is exposed using radiation or light having a desired gradient profile 412. In this example, gradient profile 412 has an inner radial dimension 414 and an outer radial dimension 416, which are both selected to achieve the desired profile for the developed photoresist layer 418 (shown in FIG. 14). Notably, the tapered edge 420 of developed photoresist layer 418 extends down to second layer 406 of material. Moreover, the slope of tapered edge 420 is approximately equal to the slope of tapered edge 405 of etched layer 404.

Figure 15:
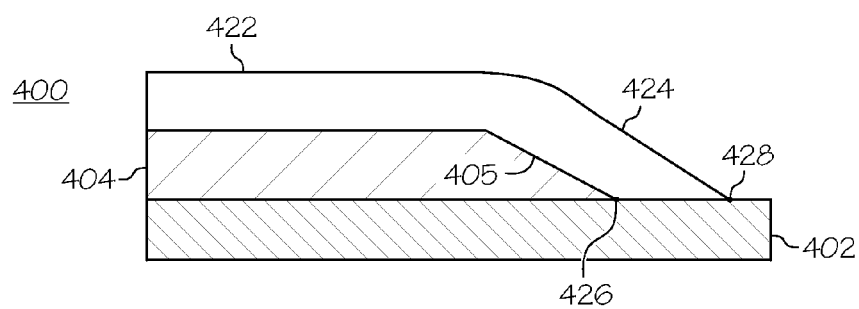

FIG. 15 depicts wafer 400 after etching of developed photoresist layer 418 and second layer 406, and after removal of excess photoresist material. This etching step results in a second etched layer 422 of material having a tapered edge 424. Etched layer 422 covers etched layer 404 and extends over a portion of substrate 402. FIG. 15 depicts an inner radial dimension 426 and an outer radial dimension 428 of etched layer 422, where these dimensions represent the boundaries that define where etched layer 422 is located directly over substrate 402. In practice, these dimensions can be controlled using the edge exposure process described herein. In particular, these dimensions can be controlled by setting the parameters of gradient profile 412 (see FIG. 13).

Although not shown, wafer 400 may include any number of additional layers formed on etched layer 422, where one or more of the additional layers are created using the edge exposure techniques described herein. For example, a third layer of material may be formed and etched in the manner described above for etched layer 422. The etched third layer would cover etched layer 422 and extend beyond the tapered edge of etched layer 422 (and over a portion of substrate 402 near the outer edge of wafer 400). Alternatively, it may be desirable to form a third layer of material over etched layer 422 in a conventional manner such that it generally follows the contour of etched layer 422 and covers the tapered edge of etched layer. In other words, it may not be necessary to utilize gradient illumination on higher layers of material.

While at least one example embodiment has been presented in the foregoing detailed description, it should be appreciated that a vast number of variations exist. It should also be appreciated that the example embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An edge exposure method for a semiconductor wafer, the method comprising:
    setting an inner boundary and an outer boundary for gradient illumination;
    forming a first layer of material on a substrate having an outer periphery;
    forming a first layer of photoresist on the first layer of material;
    exposing the first layer of photoresist near the outer periphery with gradient illumination, resulting in a first exposed photoresist layer, wherein exposing the first layer of photoresist is governed by the inner boundary and the outer boundary;
    developing the first exposed photoresist layer, resulting in a first developed photoresist layer having a tapered edge in cross section; and
    etching the first developed photoresist layer and the first layer of material, resulting in a first etched layer of material having a tapered edge in cross section.

2. A method according to claim 1, further comprising forming a second layer of material over the first etched layer of material.

3. A method according to claim 1, further comprising setting a gradient profile for the gradient illumination, wherein exposing the first layer of photoresist is governed by the gradient profile.

4. A method according to claim 2, further comprising:
    forming a second layer of photoresist on the second layer of material;
    exposing the second layer of photoresist near the outer periphery with gradient illumination, resulting in a second exposed photoresist layer;
    developing the second exposed photoresist layer, resulting in a second developed photoresist layer having a tapered edge in cross section; and
    etching the second developed photoresist layer and the second layer of material, resulting in a second etched layer of material having a tapered edge in cross section.

5. A method according to claim 4, further comprising controlling the steps of exposing the second layer of photoresist, developing the second exposed photoresist layer, and etching the second developed photoresist layer and the second layer of material such that the tapered edge of the second etched layer of material is continuous with the tapered edge of the first etched layer of material.

6. A method according to claim 4, wherein:
    the tapered edge of the first etched layer of material defines a lower perimeter of the first layer of material, an upper perimeter of the first layer of material, and a sloped surface of the first layer of material between the lower perimeter and the upper perimeter of the first layer of material;
    the tapered edge of the second etched layer of material defines a lower perimeter of the second layer of material, an upper perimeter of the second layer of material, and a sloped surface of the second layer of material between the lower perimeter and the upper perimeter of the second layer of material; and
    the upper perimeter of the first layer of material corresponds to the lower perimeter of the second layer of material.

7. An edge exposure method for a semiconductor wafer having a substrate, a layer of material formed on the substrate, and a layer of photoresist formed on the layer of material, the method comprising:
    obtaining an inner radius and an outer radius for an illumination gradient;
    obtaining a gradient profile for the illumination gradient;
    exposing a peripheral section of the layer of photoresist with radiation controlled by the illumination gradient; and
    creating, in response to the exposing step, an exposed photoresist layer having non-uniform characteristics between the inner radius and the outer radius, the non-uniform characteristics being controlled by the illumination gradient.

8. A method according to claim 7, further comprising developing the exposed photoresist layer, resulting in a developed photoresist layer having a tapered edge in cross section.

9. A method according to claim 7, wherein:
    the layer of photoresist is formed from a positive photoresist material; and
    the gradient profile results in relatively low radiation energy near the inner radius during the exposing step, and relatively high radiation energy near the outer radius during the exposing step.

10. A method according to claim 8, further comprising etching the developed photoresist layer and the layer of material, resulting in an etched layer of material having a tapered edge in cross section.

11. A method according to claim 10, further comprising forming an additional layer of material over the etched layer of material.

12. A method according to claim 10, wherein the inner radius, the outer radius, and the gradient profile influence a slope characteristic of the tapered edge of the etched layer of material.

13. An edge exposure method for a semiconductor wafer having a substrate, a layer of material formed on the substrate, and a layer of photoresist formed on the layer of material, the method comprising:
 exposing a peripheral section of the layer of photoresist with radiation having an intensity profile that varies between an inner radial dimension of the semiconductor wafer and an outer radial dimension of the semiconductor wafer, resulting in an exposed photoresist layer;
 developing the exposed photoresist layer, resulting in a developed photoresist layer having a tapered peripheral photoresist edge; and
 etching the developed photoresist layer and the layer of material, resulting in an etched layer of material having a tapered peripheral material edge.

14. A method according to claim 13, further comprising forming an additional layer of material over the etched layer of material, wherein the additional layer of material has a contour that follows the tapered peripheral material edge.

15. A method according to claim 13, further comprising selecting, prior to the exposing step, the inner radial dimension, the outer radial dimension, and the intensity profile.

16. A method according to claim 13, wherein:
 the layer of photoresist is formed from a positive photoresist material; and
 the intensity profile results in relatively low radiation energy near the inner radial dimension during the exposing step, and relatively high radiation energy near the outer radial dimension during the exposing step.

* * * * *